United States Patent
Na et al.

[11] Patent Number: 5,942,767
[45] Date of Patent: *Aug. 24, 1999

[54] THIN FILM TRANSISTORS INCLUDING SILICIDE LAYER AND MULTILAYER CONDUCTIVE ELECTRODES

[75] Inventors: Byoung-Sun Na; Dong-Gyu Kim, both of Kyungki-do, Rep. of Korea

[73] Assignee: Samsung Electronics Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/754,396

[22] Filed: Nov. 21, 1996

[30] Foreign Application Priority Data

Nov. 21, 1995 [KR] Rep. of Korea ............... 95-42523

[51] Int. Cl.⁶ .................................................. H01L 21/441
[52] U.S. Cl. ................... 257/59; 257/57; 257/72; 257/382; 257/383; 257/384; 257/757; 257/758
[58] Field of Search .................................. 257/57, 66, 72, 257/59, 347, 382, 383, 384, 748, 751, 754, 757–763, 765, 766, 770, 771

[56] References Cited

U.S. PATENT DOCUMENTS

| | | | |
|---|---|---|---|
| 4,835,593 | 5/1989 | Arnold et al. | 257/766 |
| 5,177,577 | 1/1993 | Taniguchi et al. | 257/59 |
| 5,300,813 | 4/1994 | Joshi et al. | 257/757 |
| 5,334,860 | 8/1994 | Naito | 257/59 |
| 5,384,485 | 1/1995 | Nishida et al. | 257/384 |

*Primary Examiner*—Fetsum Abraham
*Attorney, Agent, or Firm*—Myers Bigel Sibley & Sajovec

[57] ABSTRACT

Thin film transistors include a silicide layer between a doped amorphous silicon layer and source/drain electrodes. The source/drain electrodes include a first non-silicidable layer and a second non-oxidizing layer. In order to form the silicide layer, a silicidable metal layer is deposited on the doped amorphous silicon layer, reacted to form a silicide, and the unsilicided portion of the metal layer is removed. High performance thin film transistors are thereby provided.

14 Claims, 3 Drawing Sheets

THIN FILM TRANSISTORS INCLUDING SILICIDE LAYER AND MULTILAYER CONDUCTIVE ELECTRODES

FIELD OF THE INVENTION

This invention relates to microelectronic devices and fabrication methods, and more particularly to thin film transistors and fabrication methods therefor.

BACKGROUND OF THE INVENTION

Thin film transistors, hereinafter referred to as "TFT", are widely used in liquid crystal display (LCD) devices and other microelectronic applications. In general, a TFT liquid crystal display includes a thin film transistor array substrate, a spaced apart color filter substrate and a liquid crystal material therebetween. The thin film transistor array substrate includes an array of thin film transistors, electrodes and signal lines.

Referring now to FIG. 1, a conventional TFT used for an LCD will now be described. As shown in FIG. 1, a gate electrode 12 is formed on the substrate 10 and a gate insulating layer 14 is deposited thereon. An amorphous silicon layer 16 is formed on the gate insulating layer 14. The amorphous silicon layer 16 operates as a channel for the thin film transistor.

A highly doped amorphous silicon layer 161, for example an n+ doped amorphous silicon layer 161, and a silicide layer 18 are formed on the gate insulating layer 14. A chromium layer 181 is formed on the silicide layer 18, to provide source/drain electrodes. The silicide layer 18 is generally formed of chromium silicide, which is formed by reaction of the n+ amorphous silicon layer 161 and the chromium layer 181. As is well known, the silicide layer 18 in combination with the n+ amorphous silicon layer 161, improves the ohmic contact between the channel layer 16 and the source/drain electrodes.

Unfortunately, in the TFT of FIG. 1, the source/drain electrodes may include an open near the edge of the gate electrode 12, due to the topological difference between the substrate 10 and the gate electrode 12. Moreover, the chromium layer 181 which acts as the source/drain electrode, may have high resistivity, which may increase the delay in the thin film transistor and degrade its performance.

In order to overcome the above problems, double layer source/drain electrode structures have been suggested. In particular, the double layer structure includes a layer of relatively high resistivity and a layer of relatively low resistivity. Accordingly, the net resistivity of the source/drain electrodes may be lowered and open circuits at the source/drain electrodes may be reduced.

For example, as shown in FIG. 2, a lower layer 281 is formed of chromium which is silicidable but which has a high resistivity. An upper layer 282 is made of aluminum which is not silicidable, but which has relatively low resistivity. The lower part of the lower layer 281 is silicided to form a silicide layer 28.

FIG. 3 illustrates another example of a TFT which can provide lower resistivity. As shown in FIG. 3, a lower layer 381 is formed of aluminum and an upper layer 382 is formed of chromium. Since the lower layer 381 is not silicidable, a silicide layer is not formed.

In the TFTs of FIGS. 2 and 3, since the source/drain electrode include two-layer structures, the likelihood of open circuits near the edges of the gate electrode 12 is reduced. Moreover, since one of the two layers is made of aluminum, which has a lower resistivity than chromium, the net resistivity may be lowered.

Unfortunately, in the TFT of FIG. 2, since aluminum may be easily oxidized, defects may occur near the edge of the TFT panel where the aluminum is exposed. Also, in the TFT of FIG. 3, since the lower layer is in direct contact with the n+ amorphous silicon layer 161, the ohmic contact between the amorphous silicon layer 16 and the source/drain electrodes may be degraded. Accordingly, notwithstanding the improvements of FIGS. 1, 2 and 3, there exists a need for further improvements in TFT structures and fabrication methods.

SUMMARY OF THE INVENTION

It is an object of the present invention to provide improved thin film transistors and fabrication methods therefor.

It is another object of the present invention to provide thin film transistors and fabrication methods therefor which provide improved ohmic contacts for source/drain electrodes and reduced oxidation thereof.

These and other objects are provided, according to the present invention, by thin film transistors which include a silicide layer on the amorphous silicon layer, a first non-silicidable conductive layer on the silicide layer, and a second conductive layer which does not oxidize, on the first non-silicidable conductive layer. By providing this source/drain electrode structure, low resistivity electrodes are provided with reduced susceptibility to open circuits and oxidation.

In particular, a thin film transistor according to the invention includes a substrate, a gate electrode on the substrate and a gate insulating layer on the gate electrode, opposite the substrate. An amorphous silicon layer is included on the gate insulating layer, opposite the gate electrode. A silicide layer is included on the amorphous silicon layer, opposite the gate insulating layer. A first non-silicidable conductive layer is included on the silicide layer, opposite the amorphous silicide layer. A second conductive layer is included on the first non-silicidable conductive layer, opposite the silicide layer.

In preferred embodiments of the present invention, a doped amorphous silicon layer is included between the amorphous silicon layer and the silicide layer. The silicide layer preferably comprises chromium silicide. The first non-silicidable conductive layer is of lower resistivity than the second conductive layer and preferably comprises aluminum between 4000 Å and 5000 Å thick. The second conductive layer preferably does not readily form oxides, and is preferably a chromium layer between 1000 Å and 2000 Å thick.

Thin film transistors may be fabricated according to the present invention by forming a silicidable metal layer on an amorphous silicon layer which is on an insulated gate electrode on a substrate. The silicidable metal layer and the amorphous silicon layer are reacted to convert a first portion of the silicidable metal layer into silicide, such that a second portion of the silicidable metal layer remains unsilicided. The unsilicided second portion of the silicidable metal layer is removed. The first and second conductive layers are formed on the silicide.

In fabrication methods according to the present invention, the silicide layer and the amorphous silicon layer are preferably patterned between the step of removing the unsilicided second portion of the silicidable metal layer and the step of forming the first and second conductive layers on the silicide. Then, the first and second conductive layers are formed on the patterned silicide layers. The first and second conductive layers are then patterned. As already described, the amorphous silicon layer preferably includes doped and undoped portions. The silicidable metal layer preferably comprises chromium. The first conductive layer preferably comprises aluminum, and the second conductive layer preferably comprises chromium. High performance, high reliability thin film transistors are thereby formed.

DETAILED DESCRIPTION OF PREFERRED EMBODIMENTS

Figure 1:
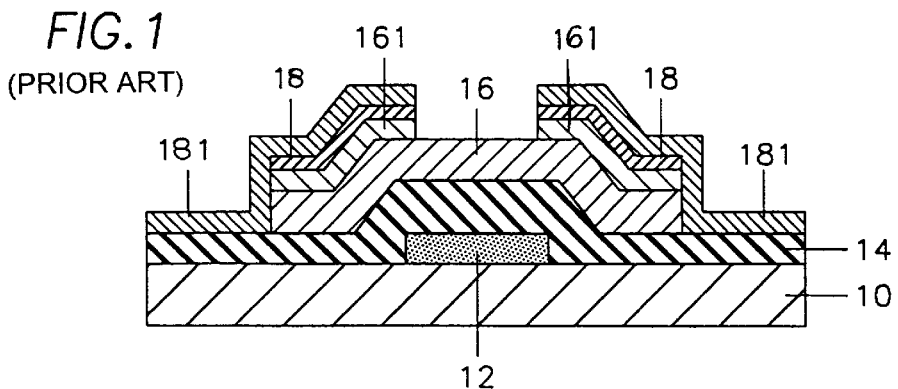
FIGS. 1–3 are cross-sectional views of conventional thin film transistors.
Figure 2:
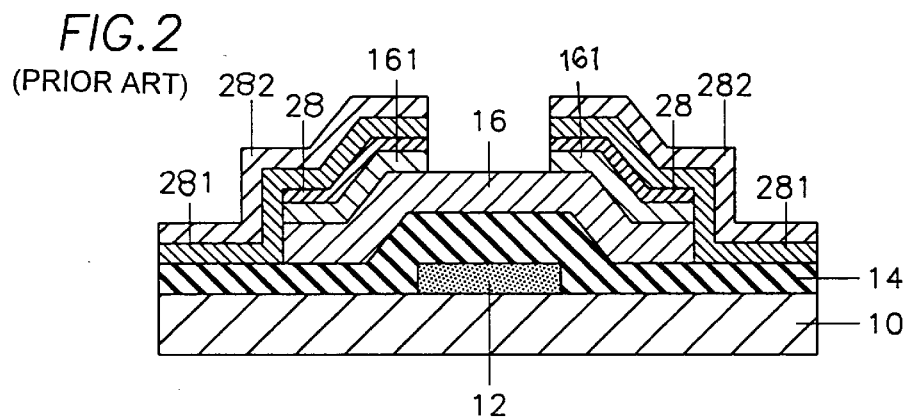
Figure 3:
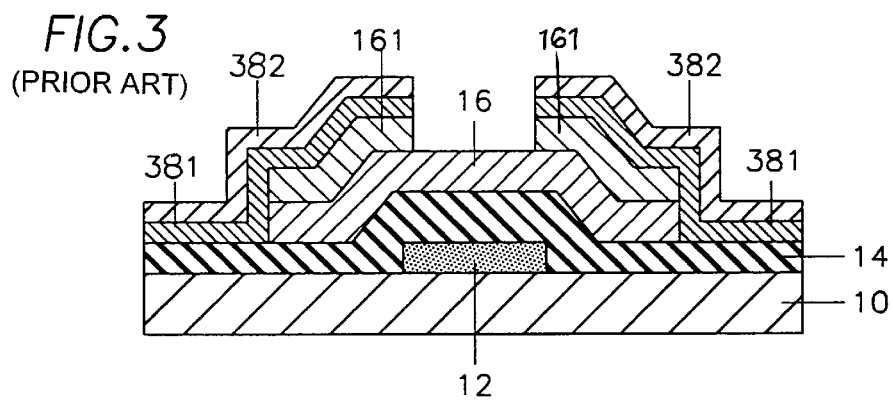

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P- or N-type; however, each embodiment described and illustrated herein includes its complementary embodiment as well. It will also be understood that when a layer is referred to as being "on" another layer, it can be directly on the other layer, or intervening layers may also be present.

Figure 4:
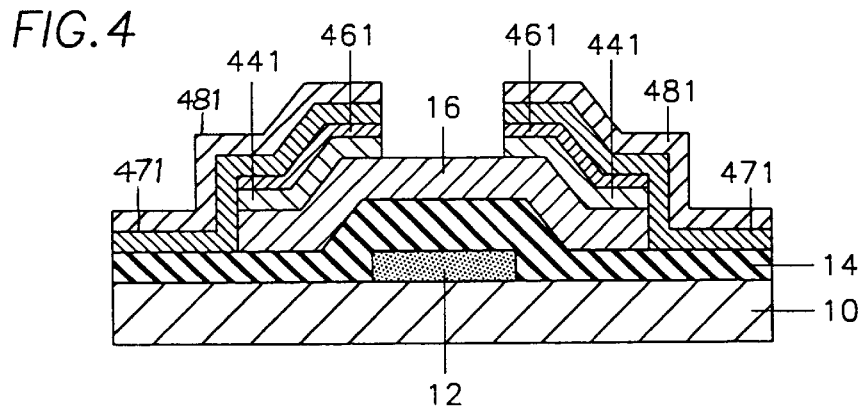
FIG. 4 illustrates a cross-sectional view of a thin film transistor according to the present invention.

Referring now to FIG. 4, a thin film transistor (hereinafter referred to as a "TFT") according to the present invention is illustrated. As shown in FIG. 4, the TFT includes a substrate 10 and a gate electrode 12 on the substrate 10. A gate insulating layer 14 is included on the gate electrode 12, opposite the substrate 10. An amorphous silicon layer is included on the gate insulating layer, opposite the gate electrode. The amorphous silicon layer includes an undoped amorphous silicon layer 16 which is formed on the gate insulating layer 14 over the gate electrode 12, and a highly doped amorphous silicon layer 441. It will be understood that the undoped amorphous silicon layer 16 and the heavily doped amorphous silicon layer 461 may be equivalently regarded as two separate layers or a single layer with doped and undoped portions.

Still referring to FIG. 4, a silicide layer 461 is included on the amorphous silicon layer, opposite the gate insulating layer. A first non-silicidable conductive layer 471 is included on the silicide layer 461, opposite the amorphous silicide layer. The first non-silicidable conductive layer is preferably formed of aluminum between 4000 Å and 5000 Å thick. Finally, a second conductive layer 481 is included on the first non-silicidable conductive layer 471, opposite the silicide layer. Second conductive layer 481 preferably does not form oxides, and is most preferably chromium between 1000 Å and 2000 Å thick.

Accordingly, the silicide layer 461 provides a low contact resistance to the amorphous silicon layer. The first non-silicidable conductive layer 471 is preferably of lower resistivity than the second conductive layer 481. The second conductive layer 481 preferably does not form oxides. Accordingly, a low resistivity, non-oxidizable TFT is provided.

As is well known to those having skill in the art, a metal silicide is a compound of metal and silicon, such as $TiSi_2$, $TaSi_2$, $MoSi_2$, $WSi_2$, $Pd_2Si$, $PtSi$ or $NiSi_2$. Any metal which is capable of forming a silicide is referred to herein as a "silicidable metal". In contrast, those metals which do not form silicides are referred to as a "non-silicidable metal". An example of a non-silicidable metal is aluminum. As is also well known, a metal oxide is a compound of metal and oxygen. For example, aluminum may be oxidized to form aluminum oxide. In contrast, chromium does not readily form oxides, i.e. it is not oxidizable.

Figure 5A:
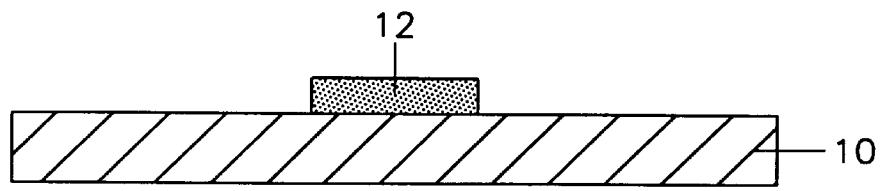
FIGS. 5A–5F are cross-sectional views illustrating the thin film transistor of FIG. 4 during intermediate fabrication steps.

FIGS. 5A–5F illustrate the TFT of FIG. 4 during intermediate fabrication steps. Referring to FIG. 5A, a gate electrode 12 is formed on a substrate 10. Then, referring to FIG. 5B, a gate insulating layer 14 is formed on the substrate 10 and on the gate electrode 12. A semiconductor layer, such as an amorphous silicon layer 16 is formed on gate insulating layer 14. An extrinsic semiconductor layer, such as a highly doped amorphous silicon layer 44, is formed on the amorphous silicon layer 16. Alternatively, a single amorphous silicon layer may be formed and then portions thereof may be doped. A silicidable metal layer, such as chromium layer 45 is formed on the highly doped amorphous silicon layer 44.

It will be understood that various techniques for forming layers and regions 12, 14, 16, 44 and 45 are known to those having skill in the art, which need not be described herein. It will also be understood that gate electrode 12 and insulating layer 14 form an insulated gate electrode. When the gate electrode 12 is anodically oxidizable, it may also be anodically oxidized. The thickness of the chromium layer 45 may be about 500 Å.

Figure 5B:
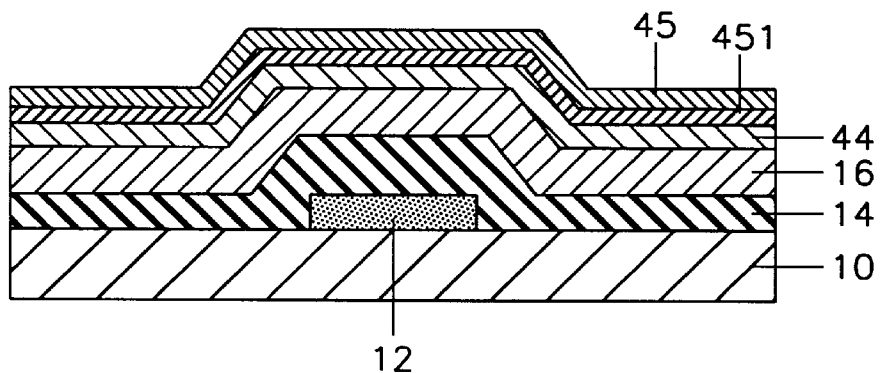

Still referring to FIG. 5B, the silicidable metal layer 45 is reacted with the amorphous silicon layer 44 to convert a first portion of the silicidable metal layer into chromium silicide layer 451, such that a second portion of the silicidable metal layer 45 remains unsilicided. The silicide reaction is well known to those having skill in the art, and need not be described further herein.

Figure 5C:
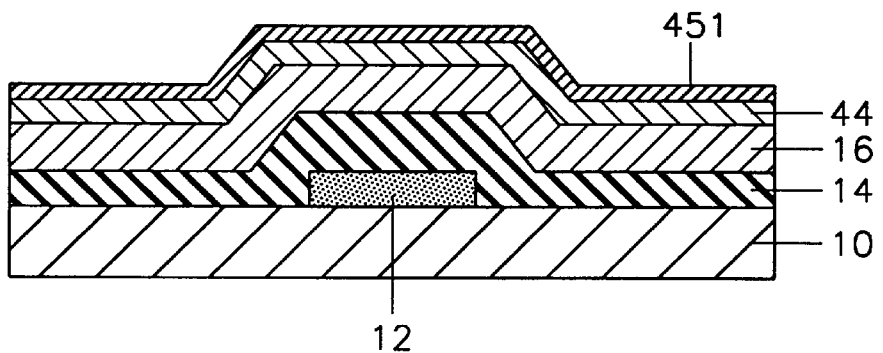

Referring now to FIG. 5C, the unsilicided second portion 45 of the silicidable metal layer is removed. The silicide layer 451 remains.

Figure 5D:
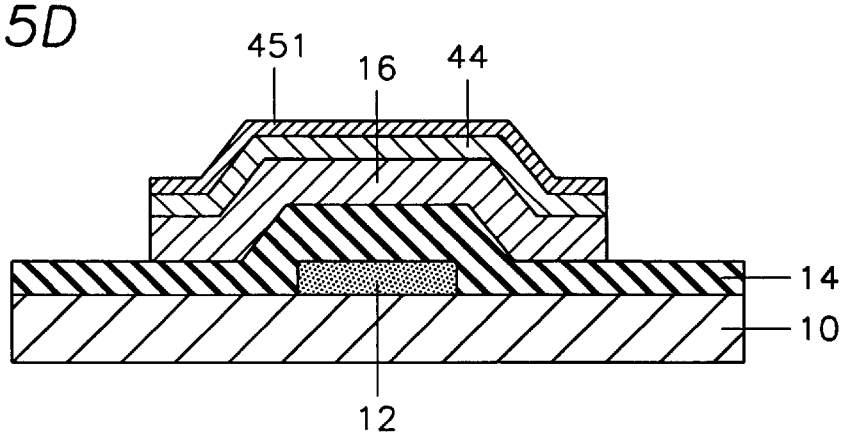

Referring now to FIG. 5D, patterning is performed, using masking or other techniques well known to those having skill in the art, to pattern silicide layer 451, doped amorphous silicon layer 44 and undoped amorphous silicon layer 16.

Figure 5E:
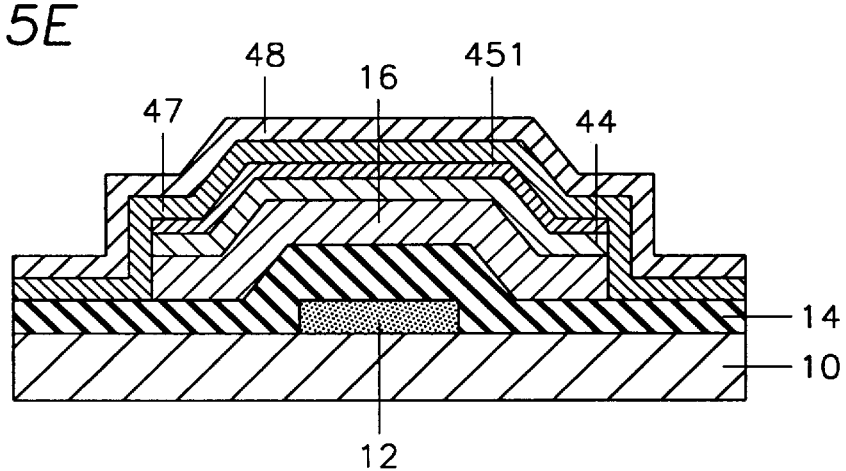

Referring now to FIG. 5E, an aluminum layer 47 and a molybdenum or chromium layer 48 are formed, using deposition or other conventional techniques. Aluminum layer 47 is of relatively low resistivity. In contrast, molybdenum or chromium layer 48 is of relatively high resistivity, but is not oxidizable. Aluminum layer 47 is preferably between 4000 Å and 5000Å in thickness, and molybdenum or chromium layer 48 is preferably between 1000 Å and 2000 Å thick.

Figure 5F:
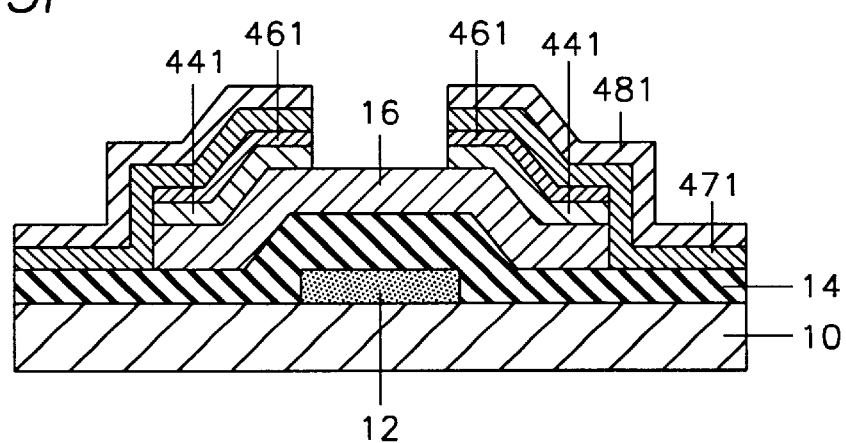

Finally, as shown in FIG. 5F, patterning is performed on the chromium layer 48, aluminum layer 47, doped amorphous silicon layer 44 and silicide layer 451, to form source/drain electrodes for the TFT, as already described in FIG. 4.

As described above, since a silicide layer is formed between the doped amorphous silicon layer and the source/ drain electrodes, a low resistivity ohmic contact is formed. Moreover, since the outer electrode layer is formed of a material which is not readily oxidizable, defects in the source/drain electrodes due to oxidation are decreased. High performance TFTs are thereby obtained.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A thin film transistor comprising:
   a substrate;
   a gate electrode on the substrate;
   a gate insulating layer on the gate electrode, opposite the substrate;
   an amorphous silicon layer on the gate insulating layer, opposite the gate electrode;
   a silicide layer on the amorphous silicon layer, opposite the gate insulating layer;
   a first nonsilicidable conductive layer on the silicide layer, opposite the amorphous silicide layer; and
   a second conductive layer that does not form oxides, on the first nonsilicidable conductive layer, opposite the silicide layer.

2. A thin film transistor according to claim 1 further comprising a doped amorphous silicon layer between the amorphous silicon layer and the silicide layer.

3. A thin film transistor according to claim 1 wherein the silicide layer comprises chromium silicide.

4. A thin film transistor according to claim 1 wherein the first nonsilicidable conductive layer is of lower resistivity than the second conductive layer.

5. A thin film transistor according to claim 1 wherein the first nonsilicidable conductive layer comprises aluminum.

6. A thin film transistor according to claim 5 wherein the first nonsilicidable layer is between 4000 Å and 5000 Å thick.

7. A thin film transistor according to claim 1 wherein the second conductive layer comprises chromium.

8. A thin film transistor according to claim 7 wherein the second conductive layer is between 1000 Å and 2000 Å thick.

9. A thin film transistor according to claim 1 wherein the amorphous silicon layer includes doped and undoped portions.

10. A thin film transistor comprising:
    a substrate;
    a gate electrode on the substrate;
    a gate insulating layer on the gate electrode, opposite the substrate;
    an amorphous silicon layer on the gate insulating layer, opposite the gate electrode;
    a chromium silicide layer on the amorphous silicon layer, opposite the gate insulating layer;
    an aluminum layer on the chromium silicide layer, opposite the amorphous silicide layer; and
    a chromium layer on the aluminum layer, opposite the chromium silicide layer.

11. A thin film transistor according to claim 10 further comprising a doped amorphous silicon layer between the amorphous silicon layer and the chromium silicide layer.

12. A thin film transistor according to claim 10 wherein the aluminum layer is between 4000 Å and 5000 Å thick.

13. A thin film transistor according to claim 12 wherein the chromium layer is between 1000 Å and 2000 Å thick.

14. A thin film transistor according to claim 10 wherein the amorphous silicon layer includes doped and undoped portions.

* * * * *